(12) United States Patent
Chang et al.

(10) Patent No.: US 12,707,900 B2
(45) Date of Patent: Aug. 11, 2026

(54) RESISTIVE RANDOM ACCESS MEMORY DEVICE AND METHOD FOR FABRICATING THE SAME

(71) Applicant: UNITED MICROELECTRONICS CORP., Hsinchu (TW)

(72) Inventors: Kai-Jiun Chang, Taoyuan City (TW); Yu-Huan Yeh, Hsinchu City (TW); Chuan-Fu Wang, Miaoli County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 833 days.

(21) Appl. No.: 18/082,609

(22) Filed: Dec. 16, 2022

(65) Prior Publication Data

US 2024/0164224 A1 May 16, 2024

(30) Foreign Application Priority Data

Nov. 11, 2022 (TW) .................................. 111143256

(51) Int. Cl.
*H10N 70/00* (2023.01)
*H10B 63/00* (2023.01)
*H10N 70/20* (2023.01)

(52) U.S. Cl.
CPC ........... *H10N 70/841* (2023.02); *H10B 63/80* (2023.02); *H10N 70/023* (2023.02); *H10N 70/24* (2023.02); *H10N 70/826* (2023.02); *H10N 70/8833* (2023.02)

(58) Field of Classification Search
CPC ......................... H10N 70/826; H10N 70/8265
See application file for complete search history.

(56) References Cited

U.S. PATENT DOCUMENTS

2022/0344582 A1* 10/2022 Lin ..................... H10N 70/841

* cited by examiner

*Primary Examiner* — Mark V Prenty
(74) *Attorney, Agent, or Firm* — WPAT, PC

(57) ABSTRACT

A ReRAM device includes an interlayer dielectric (ILD), a lower conductive plug, a resistance-switching element (RSE) and an upper conductive plug. The ILD has an upper surface. The lower conductive plug is disposed in the ILD, and has a top surface lower than the upper surface. The RSE is disposed above the top surface and electrically contacts with the top surface. The upper conductive plug is disposed above the RSE and electrically contacts with the RSE.

17 Claims, 6 Drawing Sheets

RESISTIVE RANDOM ACCESS MEMORY DEVICE AND METHOD FOR FABRICATING THE SAME

This application claims the benefit of Taiwan application Serial No. 111143256 filed at Nov. 11, 2022, the subject matter of which is incorporated herein by reference.

BACKGROUND

Technical Field

The disclosure relates to a semiconductor device and the method for fabricating the same, and more particularly to a resistive random access memory (ReRAM) device and the method for fabricating the same.

Description of Background

A ReRAM device is configured to apply a pulse voltage to a metal oxide film of the memory device to generate a resistance difference as the basis for determining the information storage states, such as “0” and “1”. In recent years, with the rise of neural network (NN) systems such as Artificial Intelligence (AI) and the Internet of Things (IoT), because of the advantages of high device density, low power consumption, fast programming/erasing speed and three-dimensional space stacking that can satisfy the requirements of electrical synapse applications, the ReRAM device (also referred to as a memristor) can be considered to be one of the most potential candidate device applying in the NN system.

A typical ReRAM device is formed in an interlayer dielectric layer (ILD), and is usually integrated with a logic unit formed in a logic area (not shown) to form an embedded memory device having both resistive switching cells and logic units.

However, since each of the resistive switching cells has a certain thickness and is usually not formed synchronously with the logic units at the same level, thus there is a height difference between the memory area for accommodating the resistive switching cells and the logic area for accommodating the logic units, which may deteriorate the yield of the subsequent processes carried out above these two areas, and may also cause poor contact between the resistive switching cells and the conductive plugs for connecting to external devices.

Therefore, there is a need of providing a ReRAM device and the fabrication method thereof to obviate the drawbacks encountered from the prior art.

SUMMARY

One aspect of the present disclosure is to provide a ReRAM device, wherein the ReRAM device includes an interlayer dielectric (ILD), a lower conductive plug, a resistance switching element (RSE) and an upper conductive plug. The ILD has an upper surface. The lower conductive plug is disposed in the ILD, and has a top surface lower than the upper surface. The RSE is disposed above the top surface and electrically contacts with the top surface. The upper conductive plug is disposed above the RSE and electrically contacts with the RSE.

Another aspect of the present disclosure is to provide a method for fabricating a ReRAM device, wherein the method includes steps as follows: Firstly, a lower conductive plug is formed in an ILD to make the lower conductive plug exposed from an upper surface of the ILD. Next, the lower conductive plug is etched back to make the top surface of the lower conductive plug lower than the upper surface. Then, an RSE is formed on the top surface of the lower conductive plug to make the RSE electrically contacting with the top surface of the lower conductive plug. Subsequently, an upper conductive plug is formed above the RSE to make the upper conductive plug electrically contacting with the RSE.

According to the above-mentioned embodiments, a ReRAM device and the fabrication method thereof are provided. A lower conductive plug is firstly formed in an ILD; and prior to forming an RSE that includes a lower electrode, a transition metal oxide (TMO) and an upper electrode, the lower conductive plug is etched back to form a groove, so that a top surface of the lower conductive plug is lower than an upper surface of the ILD. Next, the RSE is formed in the groove by a plurality of deposition processes (preferably, the upper surface of the RSE is aligned with the upper surface of the ILD). Subsequently, a dielectric layer is formed to cover the ILD, and an upper conductive plug is then formed to pass through the dielectric layer and electrically contact with the RSE.

Because, after the lower conductive plug is etched back, at least one portion of the RSE device of the present disclosure can be formed in the groove for accommodating the lower conductive plug. The height difference between the memory area and the logic area thus can be reduced. Such that, the yield of the subsequent processed performed above these two areas can be improved. At the same time, the problem of poor contact between the RSE and the upper conductive plug can be solved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
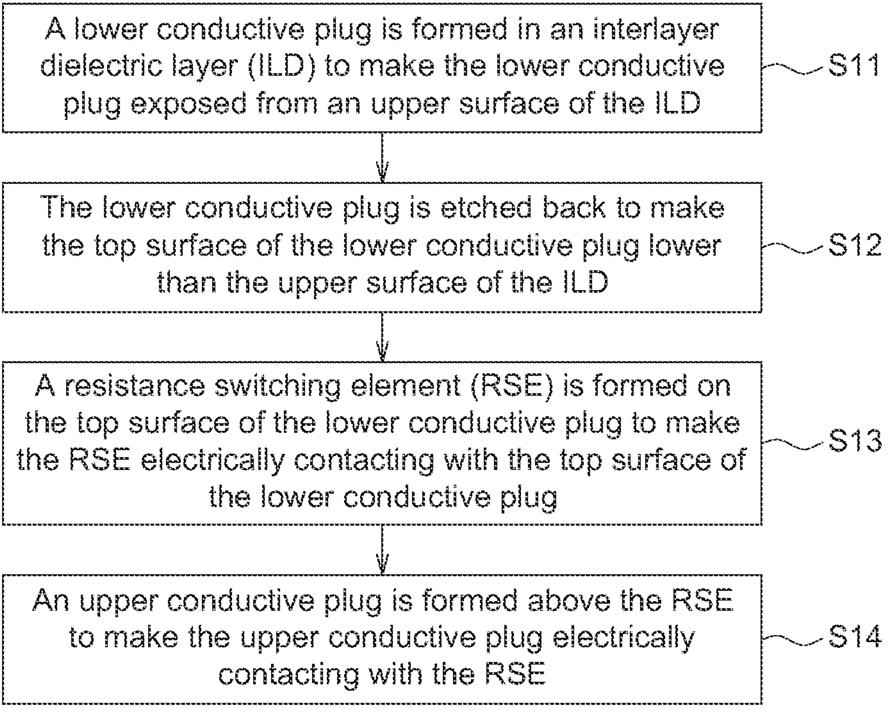
FIG. 1 is a processing flowchart illustrating a method for fabricating a ReRAM device, in accordance with one embodiment of the present disclosure.

The embodiments as illustrated below provides a ReRAM device and the fabrication method thereof to improve the yield of the ReRAM device and to solve the problem of poor contact between the RSE of the ReRAM device and the conductive plug. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regarded as illustrative rather than restrictive. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1 is a processing flowchart illustrating a method for fabricating a ReRAM device 100, in accordance with one embodiment of the present disclosure. FIGS. 2A to 2H are cross-sectional views illustrating a series of process structures for fabricating the ReRAM device 100, in accordance with one embodiment of the present disclosure. The forming of the ReRAM device 100 includes steps as follows:

Referring to step S11: A lower conductive plug 102 is formed in an interlayer dielectric layer (ILD) 101 to make the lower conductive plug 102 exposed from an upper surface 101*t* of the ILD 101. In some embodiments of the disclosure, the forming of the lower conductive plug 102 includes steps as follows:

Firstly, the interlayer dielectric layer 101 is formed by a deposition process or a spin-coating process on a semiconductor substrate 110 to cover a memory region 110M and a logic region 110L of the semiconductor substrate 110. Next, an etching process (for example, a dry photoresist-etching process) is performed to remove the portion of the ILD 101 disposed on the memory region 110M of the semiconductor substrate 110, so as to form at least one through hole (or a plurality of through holes) 103 extending downward from the upper surface 101*t* of the interlayer dielectric layer 101, from which a portion of the semiconductor substrate 110 can be exposed.

Figure 2A:
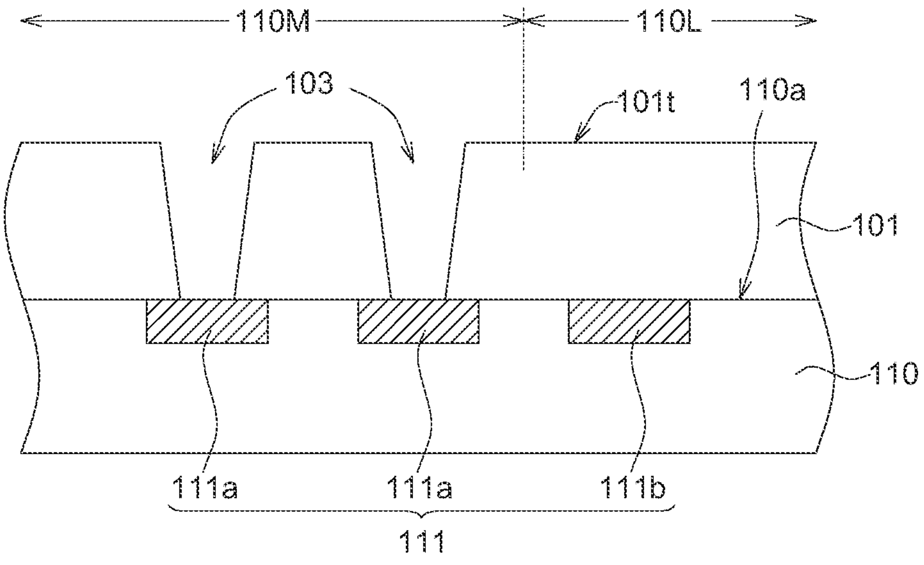
FIGS. 2A to 2H are cross-sectional views illustrating a series of process structures for fabricating the ReRAM device, in accordance with one embodiment of the present disclosure.

In the present embodiment, the semiconductor substrate 110 can be a silicon wafer. The ILD 101 can be a dielectric layer made of single material or a dielectric layer composed of multiple materials (such as, silicon oxide, silicon nitride, nitrogen doped silicon carbide (NDC), low dielectric constant (LK) material, ultra-low dielectric constant (ULK) material or arbitrary combinations of the above) covering the semiconductor substrate 110. The memory region 110M and the logic region 110L of the semiconductor substrate 110 further include at least one patterned conductive layer 111; and the portion of the patterned conductive layer 111 (for example, the metal wire 111*a*) disposed in the memory region 110M of the semiconductor substrate 110 can be exposed from the through hole 103 (as shown in FIG. 2A).

Figure 2B:
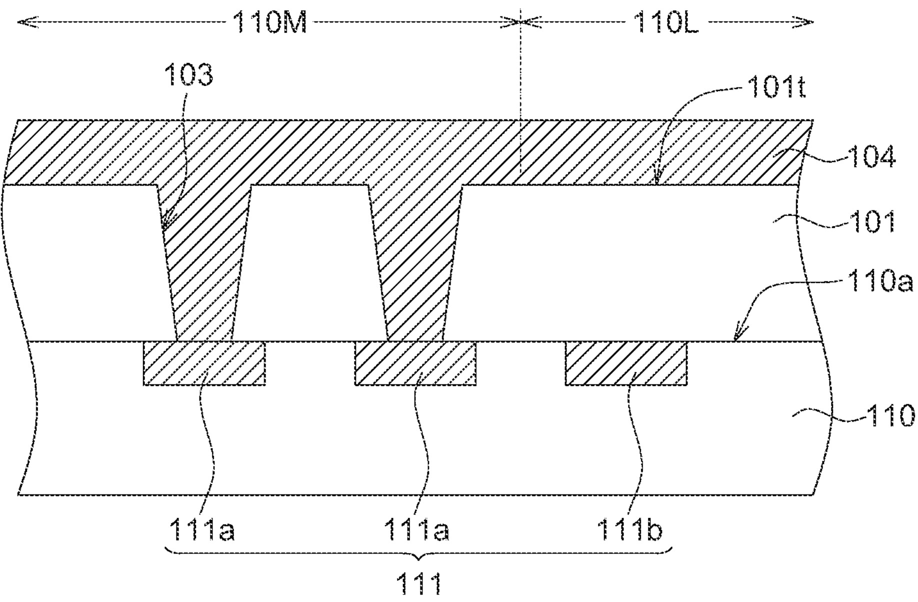
Figure 2C:
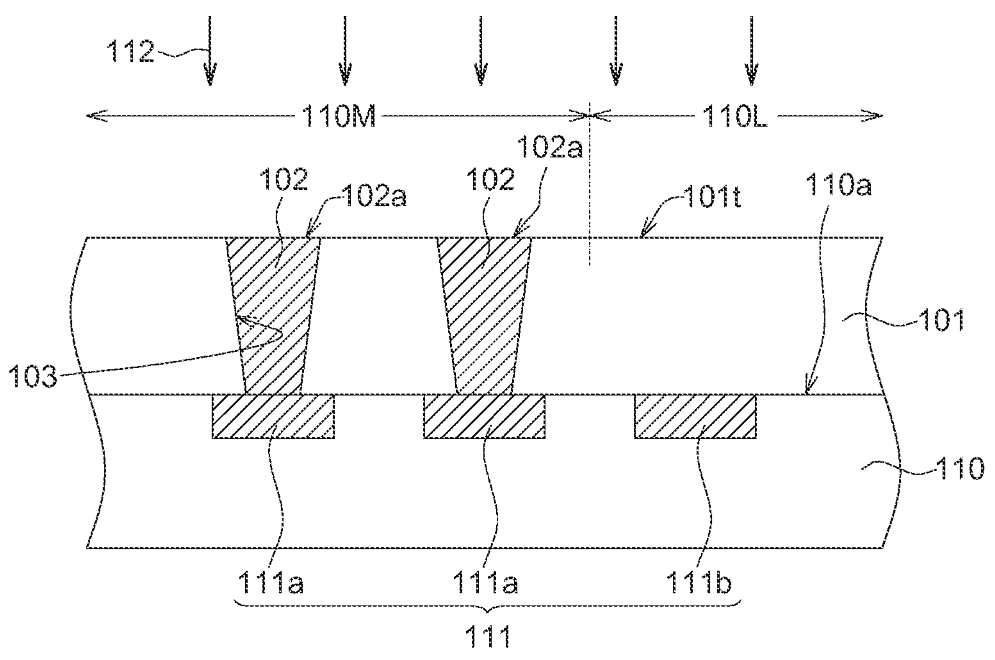

After that, a conductive layer (for example, a metal layer) 104 is formed on the upper surface 101*t* of the ILD 101 and filled in the through hole 103 (as shown in FIG. 2B). Then, a planarization process 112, using the upper surface 101*t* of the ILD 101 as a stop layer, is performed on the conductive layer 104 to remove the portion of the conductive layer 104 disposed on the upper surface 101*t* of the ILD 101, so as to form the lower conductive plug 102 in the through hole 103 and electrically contacting with the metal wire 111*a* of the patterned conductive layer 111 disposed on the surface 110*a* of the semiconductor substrate 110. Wherein, the top surface 102*a* of the lower conductive plug 102 is substantially coplanar with the upper surface 101*t* of the ILD 101 (as shown in FIG. 2C).

In the present embodiment, the lower conductive plug 102 may be made of tungsten (W), but it is not limited thereto. In some embodiments of the present disclosure, the lower conductive plug 102 may be composed of a material selected from a group consisting of copper (Cu), titanium (Ti), titanium nitride (TiN), aluminum (Al), nickel (Ni), zirconium (Zr), niobium (Nb), tantalum (Ta), ytterbium (Yb), terbium (Tb), yttrium (Y), rhodium (La), scandium (Sc), hafnium (Hf), chromium (Cr), vanadium (V), zinc (Zn), molybdenum (Mo), rhenium (Re), ruthenium (Ru), cobalt (Co), rhodium (Rh), cadmium (Pd), platinum (Pt), or an alloy or multilayer structure composed of the arbitrary combinations of the above.

Figure 2D:
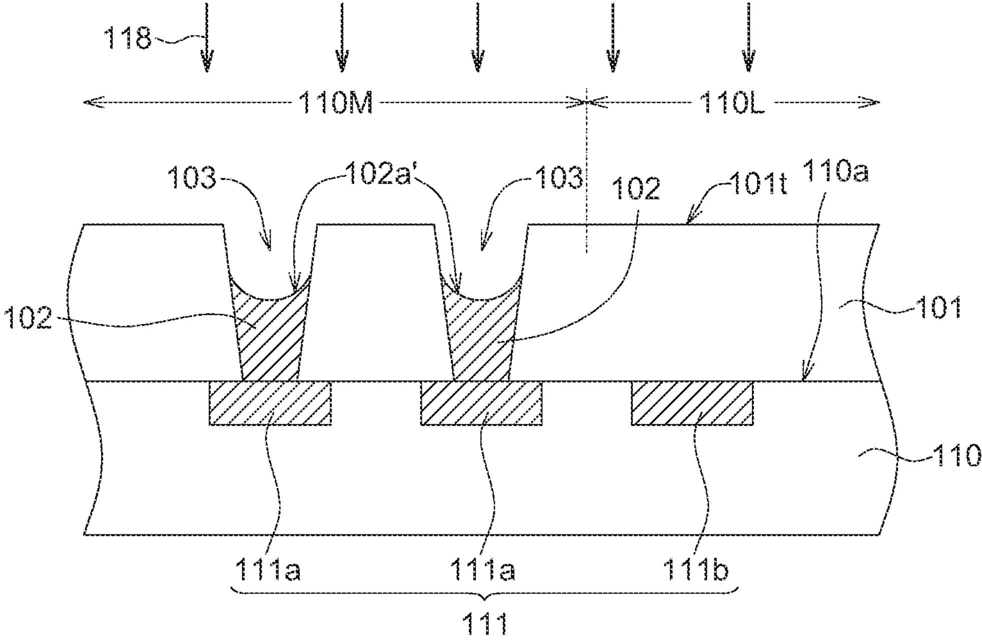

Next, as step S12: the lower conductive plug 102 is etched back 118, so as to make the top surface 102*a*' of the lower conductive plug 102 lower than the upper surface 101*t* of the ILD 101. In some embodiments of the present disclosure, a dry etch-back process, such as a reactive ion etching (RIE) process, may be performed to remove the top portion of the lower conductive plug 102, so as to make the top surface 102*a*' of the remained portion of the lower conductive plug 102 lower than the upper surface 101*t* of the ILD 101, and to expose the portions of the sidewall of the through hole 103 near the upper surface 101*t* of the ILD 101 (as shown in FIG. 2D).

However, the etch-back of the lower conductive plug 102 is not limited thereto. In some other embodiments of the present disclosure, a wet etch-back process may also be performed to remove a portion of the lower conductive plug 102. For example, in one embodiment of the present disclosure, an acid etchant containing hydrogen peroxide ($H_2O_2$) can be used to remove a portion of the conductive plug 102 made of tungsten. Alternatively, in another embodiment of the present disclosure, an alkaline etchant containing ammonium/alkali metal persulfate solutions, ferric chloride-based solutions, and ammonium hydroxide-based solutions, etc., can be used to remove a portion of the conductive plug 102 made of Cu.

Figure 2E:
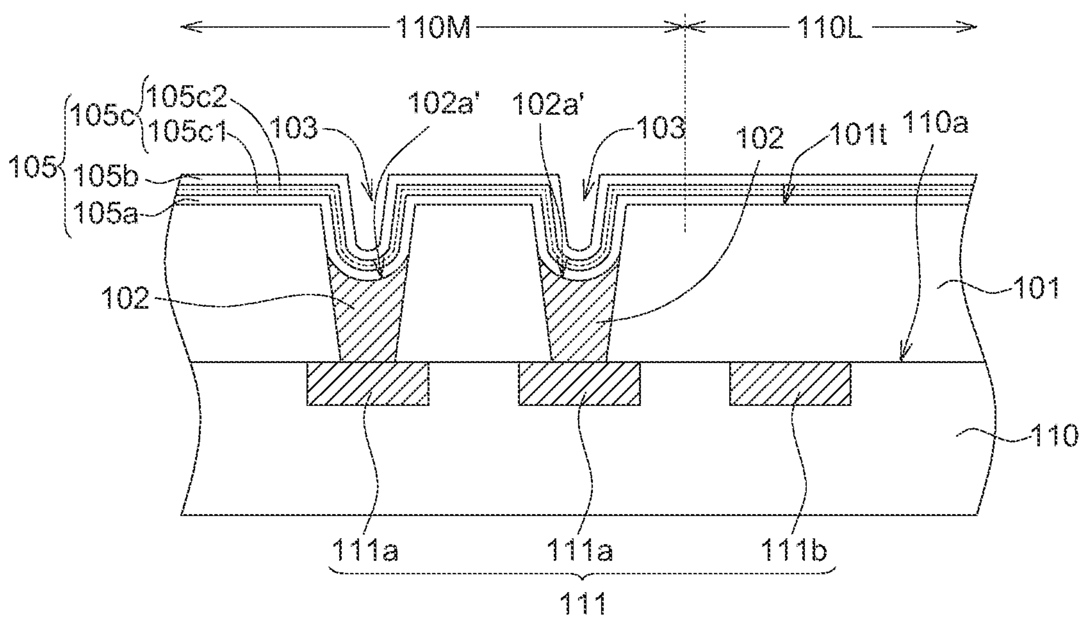

Then, as step S13: an RSE 105 is formed on the top surface 102*a*' of the lower conductive plug 102 to make the RSE 105 electrically contacting with the top surface 102*a*' of the lower conductive plug 102. In some other embodiments of the present disclosure, the forming of the RSE 105 includes steps as follows: Firstly, a plurality of deposition processes, including an atomic layer deposition (ALD) process, an epitaxial growth process, a low pressure chemical vapor deposition (LPCVD) process and/or a plasma enhanced chemical vapor deposition (PECVD) process, are performed to sequentially form a lower electrode layer 105*a*, an upper electrode layer 105*b* and a TMO layer 105*c* stacked on the upper surface 101*t* of the dielectric layer 101, the top surface 102*a*' of the lower conductive plug 102 and the exposed portion of the sidewall of the through hole 103, so as to make the lower electrode 105*a* electrically contacting with the top surface 102*a*' of the lower conductive plug 102; and to make the TMO layer 105*c* disposed between the lower electrode 105*a* and the upper electrode 105*b* (as shown in FIG. 2E).

In some embodiments of the present disclosure, the lower electrode layer 105*a* includes W or tantalum nitride (TaN). The upper electrode layer 105*b* can be a work function layer including a material selected from a group consisting of Co, Ni, lead (Plumbum (Pb)), gold (Au), Re, iridium (Ir), Ti, Hf, Pt, Ru, Al and an alloy (or multilayer structure) composed of the arbitrary combinations of the above.

The TMO layer 105*c* may be composed of a metal oxide compound represented by the chemical formula AOx, wherein A is selected from a group consisting of W, Ti, TiN, Al, Ni, Cu, zr, Hf, Nb, Ta, and the arbitrary combinations of thereof. For example, the metal oxide compound can be hafnium oxide (HfOx), zirconium oxide (ZrOx), aluminum oxide (AlOx), nickel oxide (NiOx), tantalum oxide (TaOx), titanium oxide (TiOx) or any combination of the above.

In one embodiment, the lower electrode layer 105*a* can be replaced by the lower conductive plug 102, the TMO layer 105*c* may include TaOx; the upper electrode layer 105*b* may include TaN and Ir.

In some embodiments of the present disclosure, the material distribution of the TMO layer 105*c* can be tuned by adjusting the oxygen content of the reaction gas in the ALD process. For example, the TMO layer 105*c* has a plurality of TaOx sublayers with different oxygen contents. In the present embodiment, the TMO layer 105*c* may include a first TaOx sublayer 105*c*1 disposed over the lower electrode layer 105*a*, and a second TaOx sublayer 105*c*2 disposed over the first TaOx sublayer 105*c*1. And the first TaOx sublayer 105*c*1 has oxygen content smaller than that of the second TaOx sublayer 105*c*2.

Figure 2F:
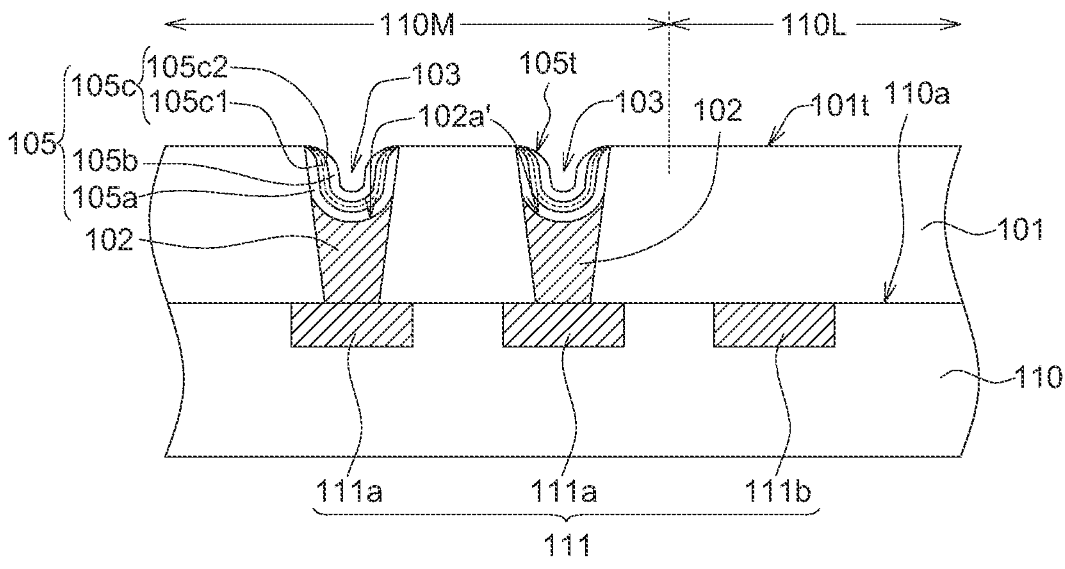

Next, a planarization process 113, using the upper surface 101*t* of the ILD 101 as a stop layer, is performed to remove portions of the lower electrode layer 105*a*, the upper electrode layer 105*b* and the TMO layer 105*c*. Wherein, the remaining portions of the lower electrode layer 105*a*, the upper electrode layer 105*b* and the TMO layer 105*c* form the RSE 105; and the RSE 105 at least partly extends into the through hole 103. For example, in the present embodiment, most of the RSE 105 is substantially disposed in the through holes 103. The top 105*t* of the RSE105 is substantially lower than the upper surface 101*t* of the ILD 101, or is at the same level as (substantially coplanar with) the upper surface 101*t* of the ILD 101. As shown in FIG. 2F, at least a portion of the upper electrode layer 105*b* of the RSE 105 is at the same level as the upper surface 101*t* of the ILD 101. In some other embodiments, the upper electrode layer 105*b* covering the TMO layer 105*c* may fill the portion of the through hole 103 lower than the upper surface 101*t* of the ILD 101, so as to make the upper electrode layer 105*b* and the upper surface 101*t* of the ILD 101 being coplanar (not shown).

Subsequently, as in step S14: an upper conductive plug 106 is formed above the RSE 105 to make the upper conductive plug 106 electrically contacting with the RSE 105. Wherein, the material constituting the upper conductive plug 106 may be the same as or different from that constituting the lower conductive plug 102. For example, in one embodiment of the present disclosure, the material constituting of the upper conductive plug 106 may be Cu. In another embodiment, the material constituting of the upper conductive plug 106 may be W.

Figure 2G:
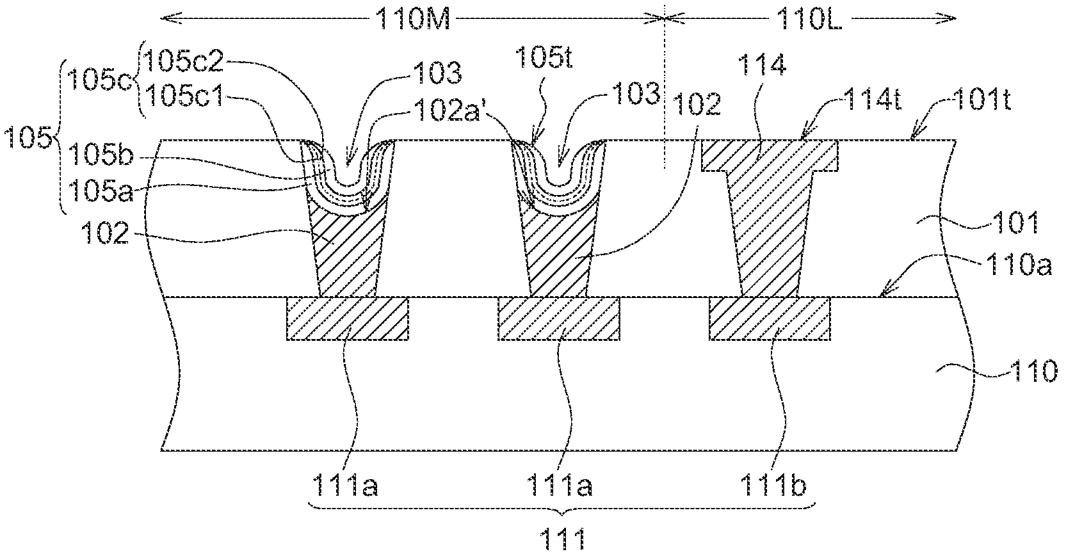

In addition, before forming the upper conductive plug 106, it may further include steps of forming a metal interconnection structure 114 in a portion of the ILD 101 covering the logic region 110L of the semiconductor substrate 110 to electrically connecting to the metal wire 111*b* of the patterned conductive layer 111. As shown in FIG. 2G, the upper surface 114*t* of the metal interconnection structure 114 is substantially coplanar with the upper surface 101*t* of the ILD 101.

Figure 2H:
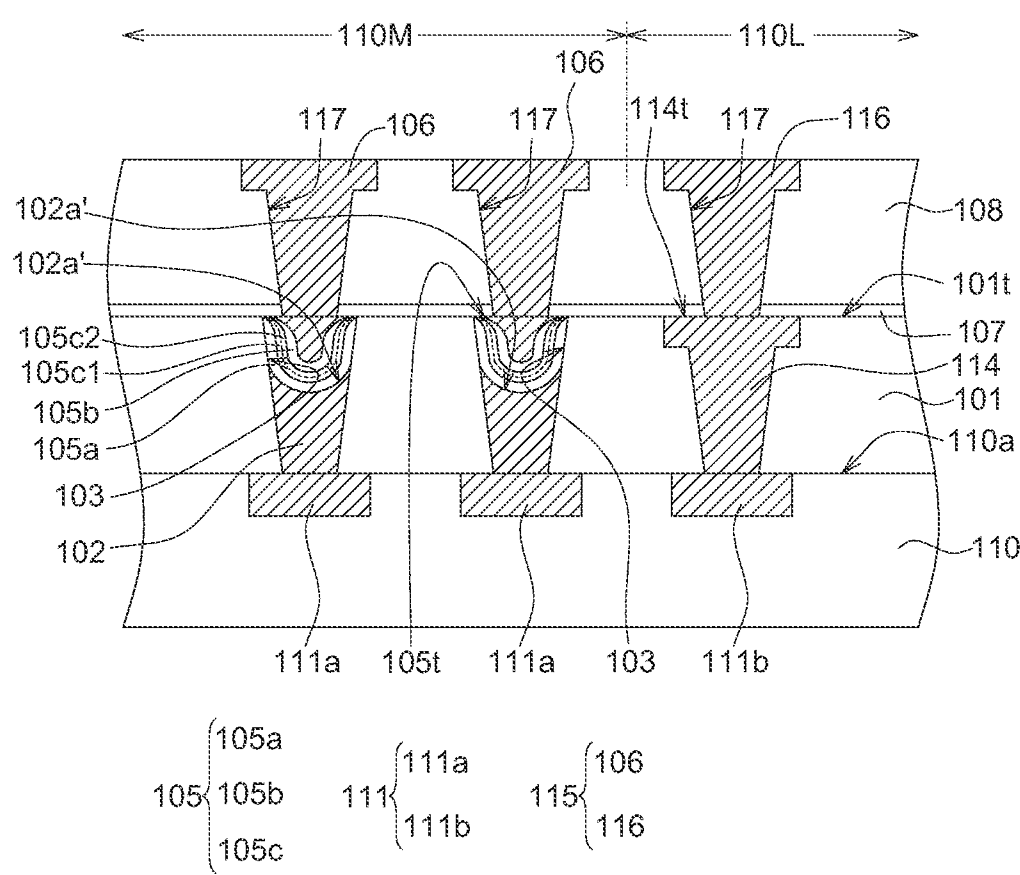

Subsequently, a series of down-stream processes (not shown) are performed, such as forming an NDC layer 107 and another ILD 108 on the upper surface 101*t* of the ILD 101, and forming a metal interconnection structure 115 passing through the NDC layer 107 and the ILD 108, so as to complete the fabrication of the ReRAM device 100 as shown in FIG. 2H. In the present embodiment, the metal interconnection structure 115 includes an upper conductive plug 106 electrically contacting the RSE 105, and an upper conductive plug 116 electrically contacting the metal interconnection structure 114.

The forming of the upper conductive plug 106 includes steps as follows: Firstly, the ILD 108 and the NDC layer 107 are patterned to form a plurality of through holes 117 in the patterned ILD 108 and the NDC layer 107 to align with the through hole 103, so as to expose the top 105*t* of the RSE 105. After that, a conductive material layer (not shown) is formed on the ILD 108, so that the conductive material layer can fill in the through holes 117 and fill in the space of the through holes 103 not filled by the lower conductive plug 102 and the RSE 105; and the conductive material layer can electrically contact with the top 105*t* of the RSE 105. Subsequently, another planarization, using the patterned ILD 108 as a stop layer, is performed to remove the portion of the conductive material layer disposed above the patterned ILD 108.

Since the top 105*t* of the RSE 105 formed in the memory region 110M of the semiconductor substrate 110 is substantially lower than the upper surface 101*t* of the ILD 101 (or at the same level as the upper surface 101*t* of the ILD 101) and at the same level as the upper surface of the metal interconnection structure 114 formed in the logic region 110L of the semiconductor substrate 110, thus the height difference between the two upper conductive plugs 106 (connecting to the RSE 105) and 116 (connecting to the metal interconnection structure 114) can be reduced. Therefore, the down-stream processes can be performed on a substantially flat surface (the surface of the memory area 110M and the logic area 110L), which helps to improve the yield of the down-stream processes.

In addition, since the upper conductive plug 106 is composed of the portions of the conductive material layer remaining both in the through hole 117 and the through hole 103, thus at least a portion of the upper conductive plug 106 extends both into the through hole 117 and the through hole 103. This approach can ensure the upper conductive plug 106 (the remaining portion of the conductive material layer) electrically contacting with the top 105*t* of the RSE 105. Therefore, the problem of poor contact between the RSE 105 and the upper conductive plug 102 can be solved.

According to the above-mentioned embodiments, a ReRAM device and the fabrication method thereof are provided. A lower conductive plug is firstly formed in an ILD; and prior to forming a RSE that includes a lower electrode, a transition metal oxide (TMO) and an upper electrode, the lower conductive plug is etched back to form a groove, so that a top surface of the lower conductive plug is lower than an upper surface of the ILD. Next, the RSE is formed in the groove by a plurality of deposition processes (preferably, the upper surface of the RSE is aligned with the upper surface of the ILD). Subsequently, a dielectric layer is formed to cover the ILD, and an upper conductive plug is then formed to pass through the dielectric layer and electrically contact with the RSE.

Because, after the lower conductive plug is etched back, at least one portion of the RSE device of the present disclosure can be formed in the groove for accommodating the lower conductive plug. The height difference between the memory area and the logic area thus can be reduced. Such that, the yield of the subsequent processed performed above these two areas can be improved. At the same time, the problem of poor contact between the RSE and the upper conductive plug can be solved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive random access memory (ReRAM) device, comprising:

an interlayer dielectric layer (ILD), having an upper surface;

a lower conductive plug, disposed in the ILD and having a top surface lower than the upper surface;

a resistance-switching element (RSE), disposed above the top surface and electrically contacting with the top surface; and an upper conductive plug, disposed above the RSE and electrically contacting with the RSE;

wherein the ILD has a through hole passing through the upper surface; the lower conductive plug is disposed in the through hole; the RSE at least partially extends into the through hole; and the RSE has a top substantially coplanar with the upper surface.

2. A ReRAM device, comprising:

an interlayer dielectric layer (ILD), having an upper surface;

a lower conductive plug, disposed in the ILD and having a top surface lower than the upper surface;

a resistance-switching element (RSE), disposed above the top surface and electrically contacting with the top surface; and an upper conductive plug, disposed above the RSE and electrically contacting with the RSE;

wherein the RSE comprises:

a lower electrode layer, electrically contacting with the top surface;

an upper electrode layer, electrically contacting with the upper conductive plug; and a transition metal oxide (TMO) layer, disposed between the lower electrode layer and the upper electrode layer.

3. The ReRAM device according to claim 2, wherein the TMO layer comprises tantalum oxide (TaOx); the upper electrode layer comprises tantalum nitride (TaN) and iridium (Ir); the upper conductive plug comprises copper (Cu); and the lower conductive plug comprises tungsten (W).

4. The ReRAM device according to claim 2, wherein the TMO layer comprises a first TaOx sublayer disposed above the lower electrode layer and a second TaOx sublayer disposed above the first TaOx sublayer; and the first TaOx sublayer layer and the second TaOx sublayer have different oxygen contents.

5. The ReRAM device according to claim 2, wherein at least a portion of the upper electrode layer has a same level as the upper surface.

6. The ReRAM device according to claim 2, wherein the ILD has a through hole passing through the upper surface; the upper electrode layer fills a portion of the through hole lower than the upper surface.

7. A ReRAM device, comprising:

an interlayer dielectric layer (ILD), having an upper surface;

a lower conductive plug, disposed in the ILD and having a top surface lower than the upper surface;

a resistance-switching element (RSE), disposed above the top surface and electrically contacting with the top surface; and an upper conductive plug, disposed above the RSE and electrically contacting with the RSE;

wherein the ILD has a through hole passing through the upper surface; the lower conductive plug is disposed in the through hole; the RSE at least partially extends into the electrical through hole; and at least a portion of the upper conductive plug extends into the through hole.

8. The ReRAM device according to claim 1, wherein the RSE comprises:

a lower electrode layer, electrically contacting with the top surface;

an upper electrode layer, electrically contacting with the upper conductive plug; and a TMO layer, disposed between the lower electrode layer and the upper electrode layer.

9. The ReRAM device according to claim 8, wherein the TMO layer comprises TaOx; the upper electrode layer comprises TaN and Ir; the upper conductive plug comprises Cu; and the lower conductive plug comprises W.

10. The ReRAM device according to claim 8, wherein the TMO layer comprises a first TaOx sublayer disposed above the lower electrode layer and a second TaOx sublayer disposed above the first TaOx sublayer; and the first TaOx sublayer layer and the second TaOx sublayer have different oxygen contents.

11. The ReRAM device according to claim 8, wherein at least a portion of the upper electrode layer has a same level as the upper surface.

12. The ReRAM device according to claim 8, wherein the upper electrode layer fills a portion of the through hole lower than the upper surface.

13. The ReRAM device according to claim 2, wherein the ILD has a through hole passing through the upper surface; and the lower conductive plug is disposed in the through hole.

14. The ReRAM device according to claim 7, wherein the RSE comprises:

a lower electrode layer, electrically contacting with the top surface;

an upper electrode layer, electrically contacting with the upper conductive plug; and a transition metal oxide (TMO) layer, disposed between the lower electrode layer and the upper electrode layer.

15. The ReRAM device according to claim 14, wherein the TMO layer comprises tantalum oxide (TaOx); the upper electrode layer comprises tantalum nitride (TaN) and iridium (Ir); the upper conductive plug comprises copper (Cu); and the lower conductive plug comprises tungsten (W).

16. The ReRAM device according to claim 14, wherein the TMO layer comprises a first TaOx sublayer disposed above the lower electrode layer and a second TaOx sublayer disposed above the first TaOx sublayer; and the first TaOx sublayer layer and the second TaOx sublayer have different oxygen contents.

17. The ReRAM device according to claim 14, wherein the upper electrode layer fills a portion of the through hole lower than the upper surface.

* * * * *